(12) United States Patent
Ware

(10) Patent No.: US 11,468,925 B2
(45) Date of Patent: Oct. 11, 2022

(54) DRAM INTERFACE MODE WITH IMPROVED CHANNEL INTEGRITY AND EFFICIENCY AT HIGH SIGNALING RATES

(71) Applicant: Rambus Inc., San Jose, CA (US)

(72) Inventor: Frederick A. Ware, Los Altos Hills, CA (US)

(73) Assignee: Rambus Inc., San Jose, CA (US)

(*) Notice: Subject to any disclaimer, the term of this patent is extended or adjusted under 35 U.S.C. 154(b) by 0 days.

(21) Appl. No.: 17/299,554

(22) PCT Filed: Dec. 2, 2019

(86) PCT No.: PCT/US2019/064052
§ 371 (c)(1),
(2) Date: Jun. 3, 2021

(87) PCT Pub. No.: WO2020/117700
PCT Pub. Date: Jun. 11, 2020

(65) Prior Publication Data
US 2022/0051705 A1    Feb. 17, 2022

Related U.S. Application Data

(60) Provisional application No. 62/774,591, filed on Dec. 3, 2018.

(51) Int. Cl.
*G11C 7/00* (2006.01)
*G11C 7/10* (2006.01)
*G11C 8/18* (2006.01)

(52) U.S. Cl.
CPC .......... *G11C 7/1039* (2013.01); *G11C 7/1066* (2013.01); *G11C 7/1069* (2013.01);
(Continued)

(58) Field of Classification Search
CPC .................................................. G11C 7/1039
(Continued)

(56) References Cited

U.S. PATENT DOCUMENTS 5,375,084 A    12/1994  Begun et al.
5,818,785 A    10/1998  Ohshima
(Continued)

OTHER PUBLICATIONS

Notification of Transmittal of the International Search Report and the Written Opinion of the International Searching Authority, or the Declaration dated Mar. 30, 2020 re: Int'l Appln. No. PCT/US2019/064052. 14 Pages.

*Primary Examiner* — Hoai V Ho
(74) *Attorney, Agent, or Firm* — Lance Kreisman; Peninsula Patent Group

(57) ABSTRACT

An IC memory controller includes a first controller command/address (C/A) interface to transmit first and second read commands for first and second read data to a first memory C/A interface of a first bank group of memory. A second command/address (C/A) interface transmits third and fourth read commands for third and fourth read data to a second memory C/A interface of a second bank group of memory. For a first operating mode, the first and second read data are received after respective first delays following transmission of the first and second read commands and at a first serialization ratio. For a second operating mode, the first and second read data are received after respective second and third delays following transmission of the first and second read commands. The second and third delays are different from the first delays and from each other. The first and second data are received at a second serialization ratio that is different than the first serialization ratio.

20 Claims, 10 Drawing Sheets

(52) U.S. Cl.
CPC .......... *G11C 7/1093* (2013.01); *G11C 7/1096* (2013.01); *G11C 8/18* (2013.01)

(58) Field of Classification Search
USPC ........................................................ 365/194
See application file for complete search history.

(56) References Cited

U.S. PATENT DOCUMENTS

| | | | |
|---|---|---|---|
| 5,862,097 A | 1/1999 | Toda | |
| 5,896,395 A | 4/1999 | Lee | |
| 6,426,901 B2 | 7/2002 | Wada | |
| 6,937,494 B2 | 8/2005 | Funaba et al. | |
| 6,956,786 B2 | 10/2005 | Partsch et al. | |
| 7,043,652 B2 | 5/2006 | Matsui | |
| 7,124,250 B2 | 10/2006 | Kyung | |
| 7,209,393 B2 | 4/2007 | Shin | |
| 7,286,415 B2 | 10/2007 | Kwon | |
| 7,363,422 B2 | 4/2008 | Perego et al. | |
| 7,590,025 B2 | 9/2009 | Wang et al. | |
| 7,613,883 B2 | 11/2009 | Bellows et al. | |
| 7,624,310 B2 | 11/2009 | Porterfield | |
| 7,668,028 B2 | 2/2010 | Kim et al. | |
| 7,679,984 B2 | 3/2010 | Kao | |
| 7,774,577 B2 | 8/2010 | Sato et al. | |
| 7,839,709 B2 | 11/2010 | Kim et al. | |
| 7,864,618 B2 | 1/2011 | Riho et al. | |
| 7,929,361 B2 | 4/2011 | Searles et al. | |
| 7,957,216 B2 | 6/2011 | Bains et al. | |
| 7,965,575 B2 | 6/2011 | Kajigaya | |
| 7,966,469 B2 | 6/2011 | Skerlj et al. | |
| 7,974,147 B2 | 7/2011 | Yoon et al. | |
| 8,069,379 B2 | 11/2011 | Perego et al. | |
| 8,243,533 B2 | 8/2012 | Ku | |
| 8,264,881 B2 | 9/2012 | Kobayashi et al. | |
| 8,332,680 B2 | 12/2012 | Best | |
| 8,375,259 B2 | 2/2013 | Porterfield | |
| 8,406,071 B2 | 3/2013 | Johnson et al. | |
| 8,498,165 B2 | 7/2013 | Hsue et al. | |
| 8,542,546 B2 | 9/2013 | Matsui et al. | |
| 8,565,033 B1 | 10/2013 | Manohararajah et al. | |
| 8,607,104 B2 | 12/2013 | Cho et al. | |
| 8,621,159 B2 | 12/2013 | Ware et al. | |
| 8,654,603 B2 | 2/2014 | Tak et al. | |
| 8,683,149 B2 | 3/2014 | Ware et al. | |
| 8,760,945 B2 | 6/2014 | Jeon | |
| 8,908,467 B2 | 12/2014 | Kwack | |
| 8,924,680 B2 | 12/2014 | Perego et al. | |
| 8,942,056 B2 | 1/2015 | Ellis et al. | |
| 8,947,942 B2 | 2/2015 | Ko et al. | |
| 8,949,520 B2 | 2/2015 | Ware et al. | |
| 8,990,490 B2 | 3/2015 | Gopalakrishnan et al. | |
| 9,043,513 B2 | 3/2015 | Perego et al. | |
| 9,047,929 B2 | 6/2015 | Seo et al. | |
| 9,111,645 B2 | 8/2015 | Kasamsetty et al. | |
| 9,117,496 B2 | 8/2015 | Shaeffer et al. | |
| 9,152,585 B2 | 10/2015 | Ware | |
| 9,165,639 B2 | 10/2015 | Ware et al. | |
| 9,183,166 B2 | 11/2015 | Shaeffer et al. | |
| 9,183,920 B2 | 11/2015 | Ware et al. | |
| 9,208,836 B1 | 12/2015 | Ware | |
| 9,209,160 B2 | 12/2015 | Lee | |
| 9,214,441 B2 | 12/2015 | Kwon et al. | |
| 9,232,651 B2 | 1/2016 | Ware et al. | |
| 9,275,699 B2 | 3/2016 | Gopalakrishnan et al. | |
| 9,280,454 B1 | 3/2016 | Elsasser et al. | |
| 9,286,999 B1 | 3/2016 | Choi et al. | |
| 9,324,397 B1 | 4/2016 | Desai et al. | |
| 9,337,872 B2 | 5/2016 | Perego | |
| 9,411,538 B2 | 8/2016 | LaBerge et al. | |
| 9,417,687 B2 | 8/2016 | Ware | |
| 9,489,323 B2 | 11/2016 | Amirkhany et al. | |
| 9,515,204 B2 | 12/2016 | Frans et al. | |
| 9,530,465 B2 | 12/2016 | Song | |
| 9,559,079 B2 | 1/2017 | Kim | |
| 9,563,597 B2 | 2/2017 | Ware et al. | |
| 9,570,121 B1 | 2/2017 | Koh | |
| 9,613,666 B1 | 4/2017 | Koh et al. | |
| 9,613,668 B2 | 4/2017 | Kikuchi | |
| 9,697,884 B2 | 7/2017 | Ware et al. | |
| 9,703,483 B2 | 7/2017 | Ware et al. | |
| 9,728,236 B1 * | 8/2017 | Sankaranarayanan | G11C 5/04 |
| 9,734,878 B1 | 8/2017 | Aquil et al. | |
| 9,734,921 B2 | 8/2017 | Ware et al. | |
| 9,792,965 B2 | 10/2017 | Best et al. | |
| 9,823,966 B1 | 11/2017 | Ware et al. | |
| 9,837,132 B2 | 12/2017 | Ware et al. | |
| 9,842,630 B2 | 12/2017 | Ware et al. | |
| 9,892,068 B2 | 2/2018 | Linstadt | |
| 9,997,233 B1 | 6/2018 | Ware et al. | |
| 2008/0229033 A1 | 9/2008 | Wallner et al. | |
| 2008/0247259 A1 | 10/2008 | Kao | |
| 2011/0264849 A1 | 10/2011 | Ware et al. | |
| 2011/0307672 A1 | 12/2011 | Ware | |
| 2013/0051110 A1 | 2/2013 | Funaki et al. | |
| 2013/0148447 A1 | 6/2013 | Shaeffer et al. | |
| 2013/0173991 A1 | 7/2013 | Ware et al. | |
| 2016/0314085 A1 | 10/2016 | Ware et al. | |
| 2017/0083461 A1 | 3/2017 | Desai et al. | |
| 2017/0091040 A1 | 3/2017 | Wright et al. | |
| 2017/0337014 A1 | 11/2017 | Ware et al. | |
| 2017/0337144 A1 | 11/2017 | Ware et al. | |
| 2017/0351627 A1 | 12/2017 | Ware et al. | |
| 2018/0019023 A1 | 1/2018 | Han | |
| 2018/0053544 A1 | 2/2018 | Ware et al. | |
| 2018/0293012 A1 * | 10/2018 | Khatri | G06F 13/1684 |

* cited by examiner

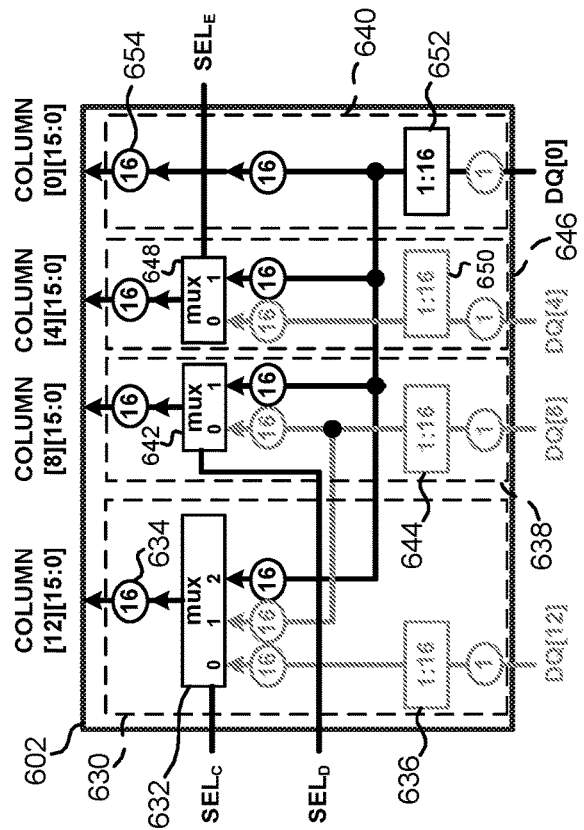
FIG. 6B
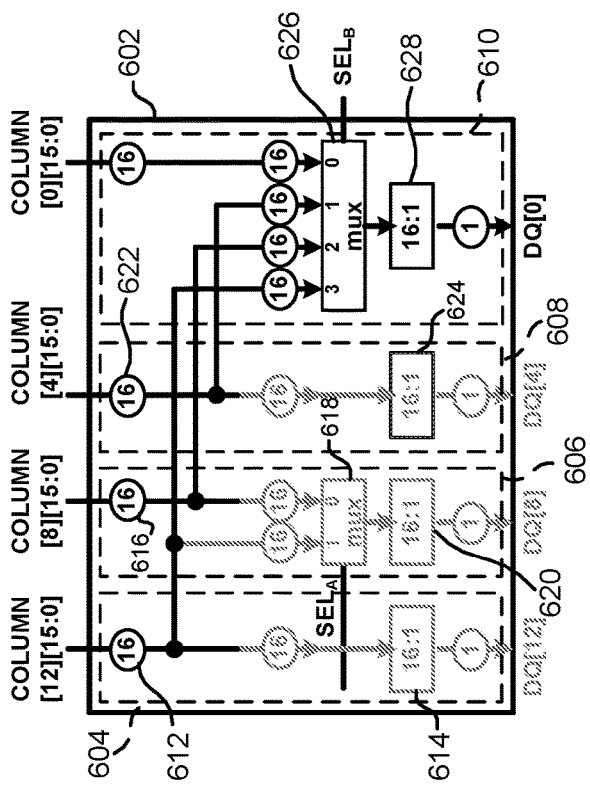
FIG. 6A
FIG. 6C

US 11,468,925 B2

DRAM INTERFACE MODE WITH IMPROVED CHANNEL INTEGRITY AND EFFICIENCY AT HIGH SIGNALING RATES

CROSS REFERENCES TO RELATED APPLICATIONS

This application is a national stage application of international application number PCT/US2019/64052, filed Dec. 2, 2019, which claims the benefit of U.S. Provisional Application No. 62/774,591, filed Dec. 3, 2018, all of which are incorporated by reference herein in their entirety.

TECHNICAL FIELD

The disclosure herein relates to memory modules, memory controllers, memory devices, and associated methods.

BRIEF DESCRIPTION OF THE DRAWINGS

Embodiments of the disclosure are illustrated by way of example, and not by way of limitation, in the figures of the accompanying drawings and in which like reference numerals refer to similar elements and in which:

FIG. 6A illustrates further detail of one embodiment of the data steering circuitry of FIG. 5, for read operations.

FIG. 6B illustrates further detail of one embodiment of the data steering circuitry of FIG. 5, for write operations.

FIG. 6C illustrates a decoder table for control signal values utilized in the data steering circuits of FIGS. 6A and 6B, and corresponding configured width modes.

DETAILED DESCRIPTION

Memory controllers, systems, devices and associated methods are disclosed. In one embodiment, an integrated circuit (IC) memory controller is disclosed that includes multiple independent data interfaces and command/address (C/A) interfaces. The independent data and C/A interfaces communicate with data and C/A interfaces disposed on each of multiple memory devices. Configurable circuitry is provided for operating the memory controller in one of multiple modes. For instance, in a first mode of operation, the memory controller may dispatch first and second read commands from a first C/A interface for corresponding first and second data converted from parallel to serial data in accordance with a first serialization ratio, and a same read timing delay. For a second mode of operation, the serialization ratio may be different as well as the read timing delays between the first read command and first data and the second read command and second data. By supporting the different operating modes, and the corresponding serialization ratios and read timing delays, various channel topologies may be realized to address different memory system capacity and performance criteria for various applications.

Figure 1:
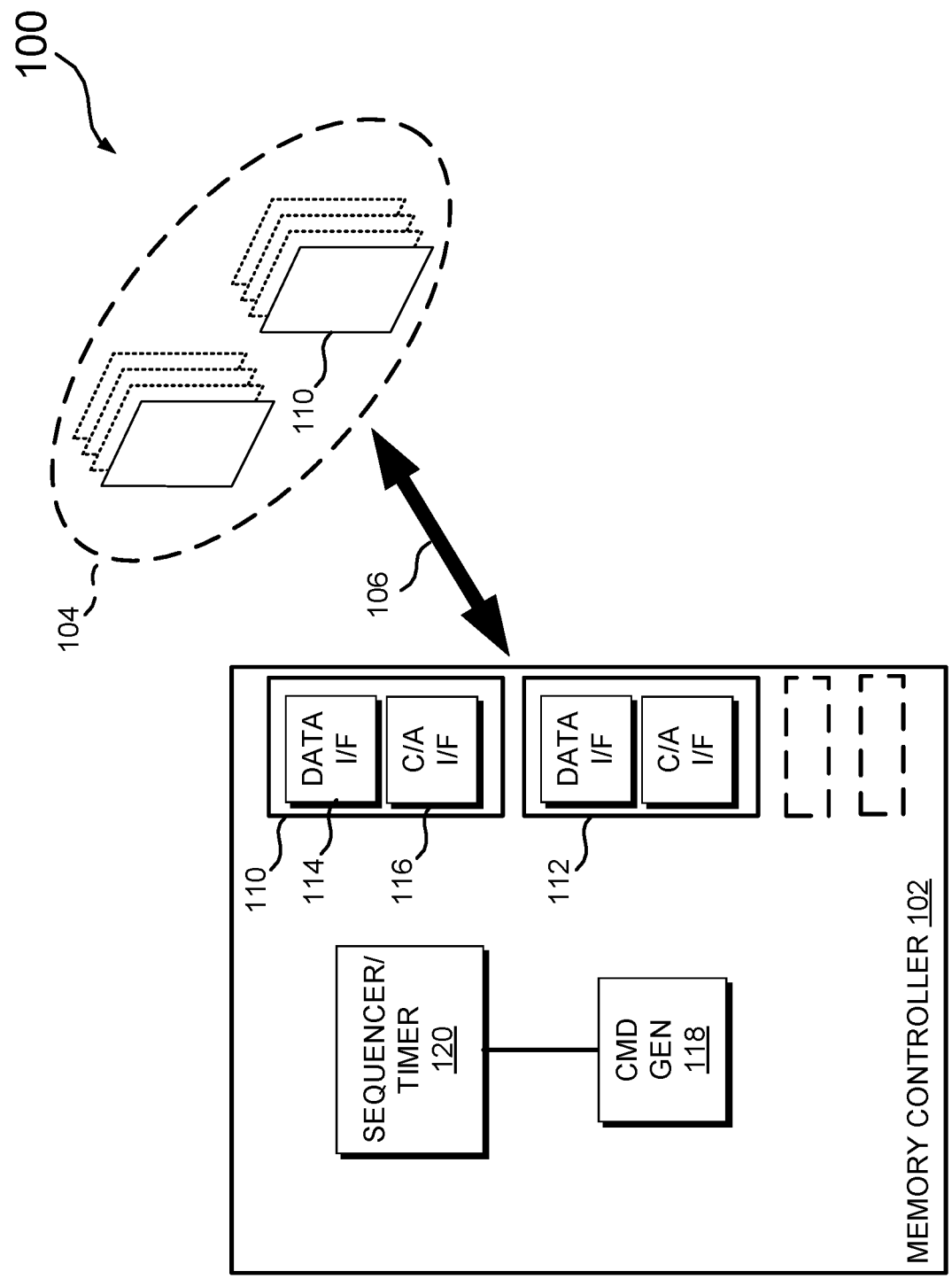
FIG. 1 illustrates one embodiment of a memory system that employs a memory controller, and multiple memory device components.

Referring now to FIG. 1, a memory system, generally designated 100, is shown that includes a memory controller 102 coupled to memory 104 via signaling medium 106. For one embodiment, the memory controller 102 is a dynamic random access memory (DRAM) controller, with the memory 104 realized as one or more DRAM memory devices 110, with each of the memory devices including circuitry that provides for a configurable data input/output (I/O) (typically referred to as "DQ") width. In some embodiments, the memory controller and memory devices may be embodied as integrated circuits, or chips. Other embodiments may employ the memory controller as a circuit in a general purpose processor. Specific embodiments for the DRAM memory controller 102 and memory 104 may be compliant with various DRAM standards, including double data rate (DDR) variants, low power (LPDDR) versions, and graphics (GDDR) types. Other embodiments may include multi-chip modules that, for example, employ stacked memory die, or stacked packages. Such embodiments may be used with the memory devices 110. Additional embodiments may stack memory die and logic die together in a common package, or in separate packages stacked upon each other.

Further referring to FIG. 1, the memory controller 102 includes at least two independent interfaces 110 and 112 for transferring data, command and control signals between the memory controller 102 and the memory 104. Each interface includes data interface circuitry 114 and command/address (C/A) interface circuitry 116. Additional interfaces may also be included to support additional memory channels, each with similar data and C/A interface circuits. Command generation circuitry 118 generates command, control, address and mode register write (MRW) commands for transmission to the memory devices 110. For one embodiment, explained below, the command generation circuitry 118 generates MRW commands for storing values associated with interface mode settings into mode registers disposed on the memory devices 104. The mode settings allow the memory controller to be configurable for a variety of operating modes consistent with multiple memory system topology architectures that take advantage of the memory device configurable width, as more fully described below.

Further referring to FIG. 1, the memory controller 102 includes a sequencer/timer circuit 120 that manages and controls the timing involved with various command and control signals. For one embodiment, the sequencer/timer enforces predefined timing constraints based on the memory controller mode of operation. The timing constraints may include any number of timing parameters, such as the time interval associated with four activate commands ($t_{FAW}$), row cycle time ($t_{RC}$), the delay interval between back-to-back activate commands ($t_{RRD}$), the delay interval between launch of a read command and receipt of corresponding read data ($t_{RL}$), and so forth. Additionally, the sequencer/timer controls various serialization/deserialization circuits that apply various serialization/deserialization ratios for data involved in read and write data transfers that may differ depending on the number of data links associated with each memory device. A given serialization ratio reflects a conversion of parallel data from among, for example, 16 parallel signal paths, to a single serial data path, resulting in a serialization ratio of 16/1. A deserialization ratio reflects a conversion of a serialized data stream from a single serial link to, for example, 16 parallel data paths, resulting in a deserialization ratio of 1/16. Additionally, a first serialization ratio applied to data transferred to a first memory device configured 4 bits wide will have four-times the serialization ratio applied to data transferred to the same memory device configured 16 bits wide.

FIGS. 2-10 illustrate various memory system configurations that are supported by the memory controller 102 described above. Each configuration defines a different operating mode that may be determined prior to manufacture of the assembled system, or through a post-assembly initialization process. Consequently, the memory controller and each of the memory devices are operable in multiple modes of operation, depending on the configuration.

Figure 2:
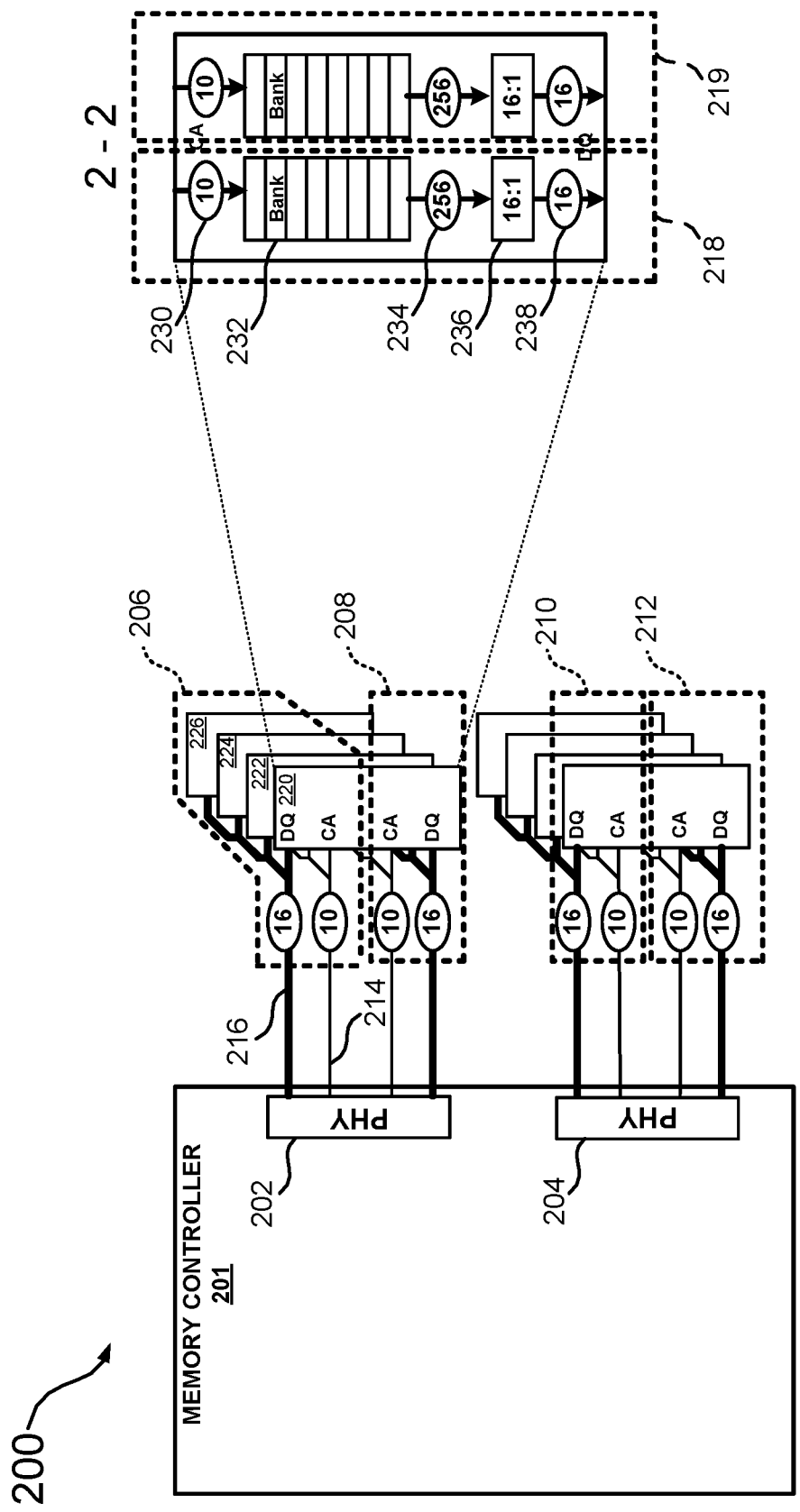
FIG. 2 illustrates one embodiment of the memory system shown in FIG. 1 that corresponds to a first operating mode.

FIG. 2 illustrates a first memory system configuration, generally designated 200, that includes the memory controller of FIG. 1, identified as 201. The system includes a memory controller 201 that employs two memory controller physical (PHY) interface circuits 202 and 204 that each control two memory channels 206, 208, and 210, 212. For each memory channel, a command/address (C/A) bus 214 and a data bus 216 couple a bank group of memory, such as at 218, associated with each of multiple memory devices 220, 222, 224, and 226 to the memory controller 201. Each memory device is a two-channel memory device with independent data and C/A interfaces for each channel. For one embodiment, the C/A bus 214 includes ten signal paths shared with the memory devices 220, 222, 224, and 226 in a multi-drop point-to-4point configuration. The data bus 216 includes sixteen signal paths that are also shared with the memory devices in a multi-drop point-to-4point configuration. With the memory devices configured with a data (DQ) input/output (I/O) width of sixteen (a 16 bit wide configuration), such that sixteen data input/output (I/O) circuits are enabled for each memory device, the sixteen data links for the data bus 216 defines a multi-drop data topology between the memory controller 201 and each memory device.

Further referring to FIG. 2, for one embodiment, each memory device, such as 220, includes at least two independent bank groups 218 and 219 that correspond to one of the channels (such as 206) in the pair of channels 206 and 208. For example, the first bank group 218 forms a portion of first channel 206, while the second bank group 219 forms a portion of the second channel 208. Detail 2-2 shows the two bank groups 218 and 219 in further detail (although oriented sideways with respect to the memory device orientation shown for ease of description). As explained above, both bank groups are formed in the same memory device, such as 220, but coupled to different memory channels 206 and 208. For one embodiment, each bank group includes ten C/A input I/O circuits, at 230, for feeding command and address information to multiple memory banks, at 232. Internal data paths, at 234, couple the memory banks to a serializer/deserializer circuit 236. The serializer/deserializer circuit, in turn, is then coupled to the data I/O circuits, at 238. Note that Detail 2-2 illustrates a read data flow having the data serialized at a serialization ratio of 16:1, while a write data flow involves a reverse flow direction and employing a 1:16 deserialization ratio.

Figure 3:
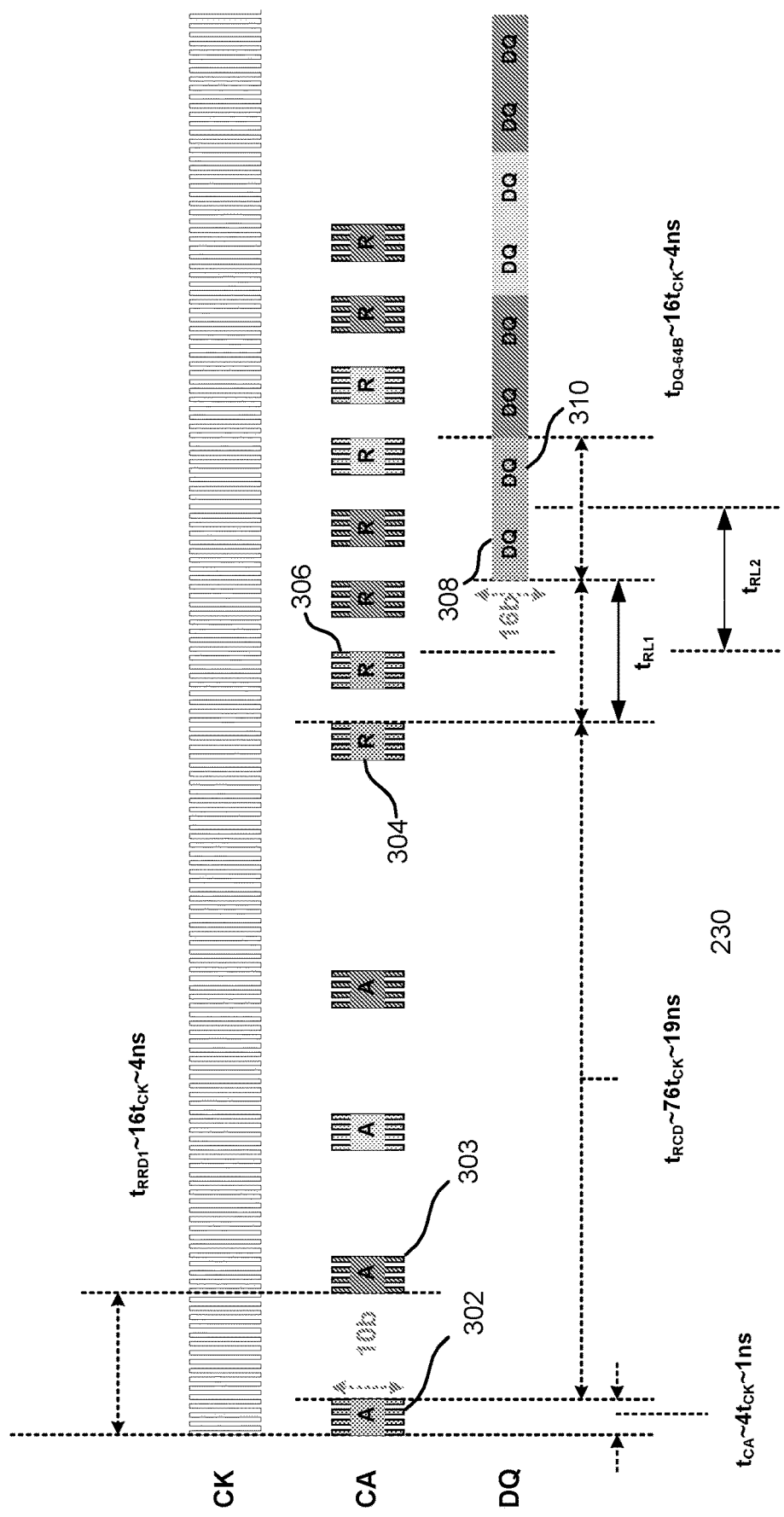
FIG. 3 illustrates a timing chart for read operations carried out by the memory system and topology of FIG. 2.

FIG. 3 illustrates a timing chart showing various command and data signal timings for multiple read operations involved in one of the four channels shown in FIG. 2. The three timing axes relate to clock signal timing CK, command signal timing CA, and data signal timing DQ. For one specific embodiment, the C/A bus signaling rate (such as 4 Gb/s) is one-half the data bus signaling rate (such as 8 Gb/s).

Further referring to FIG. 3, for a first read operation, an activate command is issued by the memory controller, at 302. A subsequent activate command for a subsequent read operation may be issued by the memory controller following a first delay $t_{RRD1}$, at 303. Following a timing interval $t_{RCD}$, dual read commands are issued, at 304 and 306, with read data associated with the first read command, at 308, transferred back to the memory controller consistent with a first read timing interval $t_{RL1}$, and second read data associated with the second read command, at 310, transferred back consistent with a second read timing interval $t_{RL2}$. For this particular mode of operation, the first and second read timing intervals $t_{RL1}$ and $t_{RL2}$ are equal, since the serialization ratio of the data transferred along each data link due to the 16 bit wide interface is relatively low. While not shown, the three other channels operate similarly, in a pipelined fashion, to optimize channel occupancy.

While operation of the memory architecture described above works well to increase memory capacity and performance, the number of shared connections employed by the multi-drop data bus 216 and C/A bus 214 for each channel may exhibit performance parameters that could be improved for certain applications. In an effort to provide an enhanced data signaling bus, a further embodiment of a memory system is shown in FIG. 4.

Figure 4:
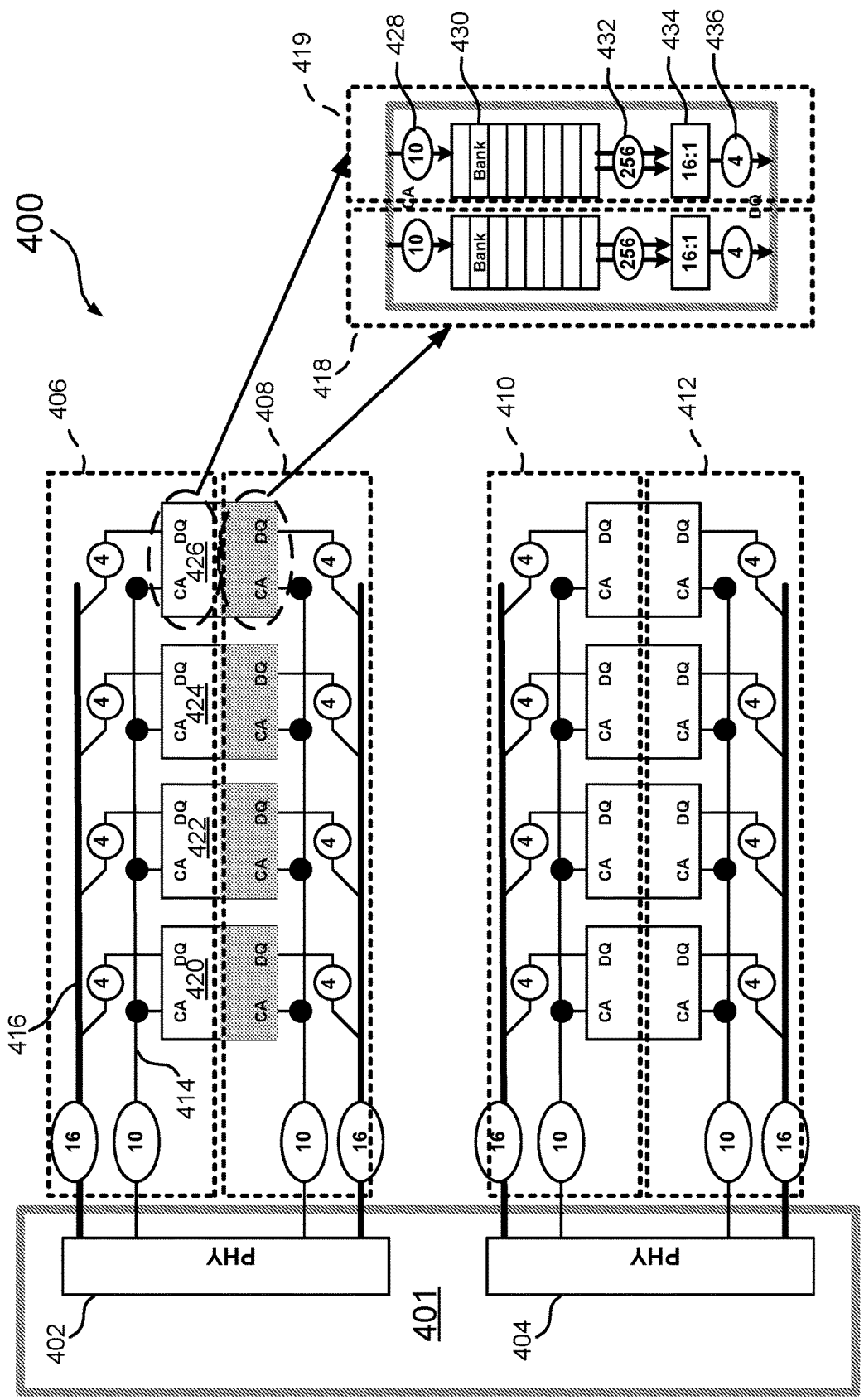
FIG. 4 illustrates a second embodiment of the memory system shown in FIG. 1 that corresponds to a second operating mode.

FIG. 4 illustrates a second embodiment of a memory system, generally designated 400, corresponding to a second specific topology, and thus a second operating mode, for the memory system 100 of FIG. 1. The system includes a memory controller 401 that employs two memory controller physical (PHY) interface circuits 402 and 404 that each control two memory channels 406, 408, and 410, 412. For each memory channel, a command/address (C/A) bus 414 and a data bus 416 couple a bank group of memory, such as at 418, associated with each of multiple memory devices 420, 422, 424, and 426 to the memory controller 401. Similar to the first embodiment described above, the C/A bus 414 includes ten signal paths shared with the memory devices in a multi-drop configuration. However, the data bus 416 implements a topology that differs from the first embodiment and includes sixteen signal paths, with groups of four signaling links routed to each memory device. With the memory devices configured 4 bits wide, such that four data input/output (I/O) circuits are enabled for each memory device, the four groups of four links for the data bus 416 define a point-to-point data architecture between the memory controller 401 and each memory device. Point-to-point signaling links often provide for improved signal integrity at higher bandwidths.

As noted above, and further referring to FIG. 4, similar to the first embodiment described above, each memory component includes an independent bank group, such as at 418, that corresponds to each of the channels, such as at 408, in the pair of channels 406 and 408. Each bank group includes an independent C/A interface and data interface. Detail 4-4 shows two bank groups 418 and 419 in further detail, both formed in the same memory device 426, but coupled to different memory channels 406 and 408. For this particular embodiment, each bank group includes a C/A interface having ten C/A input I/O circuits, at 428, for feeding command and address information to multiple memory banks, at 430. Internal data paths, at 432, couple the memory banks to a configurable serializer/deserializer circuit 434. The serializer/deserializer circuit, in turn, is then coupled to the data I/O circuits, at 436. Note that Detail 4-4 illustrates a read data flow having the read data initially serialized at a serialization ratio of 16:1 (followed by additional serialization based on the configured width), while a write data flow involves a reverse flow direction and employing a final 1:16 deserialization ratio. Further, for this specific embodiment in achieving point-to-point data links, the variable width circuitry, described more fully below, is configured 4 bits wide for each memory device.

FIGS. 5, and 6A-6C illustrate further detail relating to the configurable serializer/deserializer circuitry of FIG. 4. Generally, the serializer/deserializer circuitry (referred to subsequently as "serializer circuitry") may be configurable to support a given memory device operating with a variable width data I/O interface. Detail 5-5 illustrates, in a read operation context, how sixteen groups of sixteen-bit internal column data paths (for a total of two-hundred fifty-six paths) funnel data to four data steering circuits 502, 504, 506 and 508, that then output the data from a total of four interface I/Os (DQ[0], DQ[1], DQ[2] and DQ[3]), thereby defining a memory device interface that is 4 bits wide.

Figure 5:
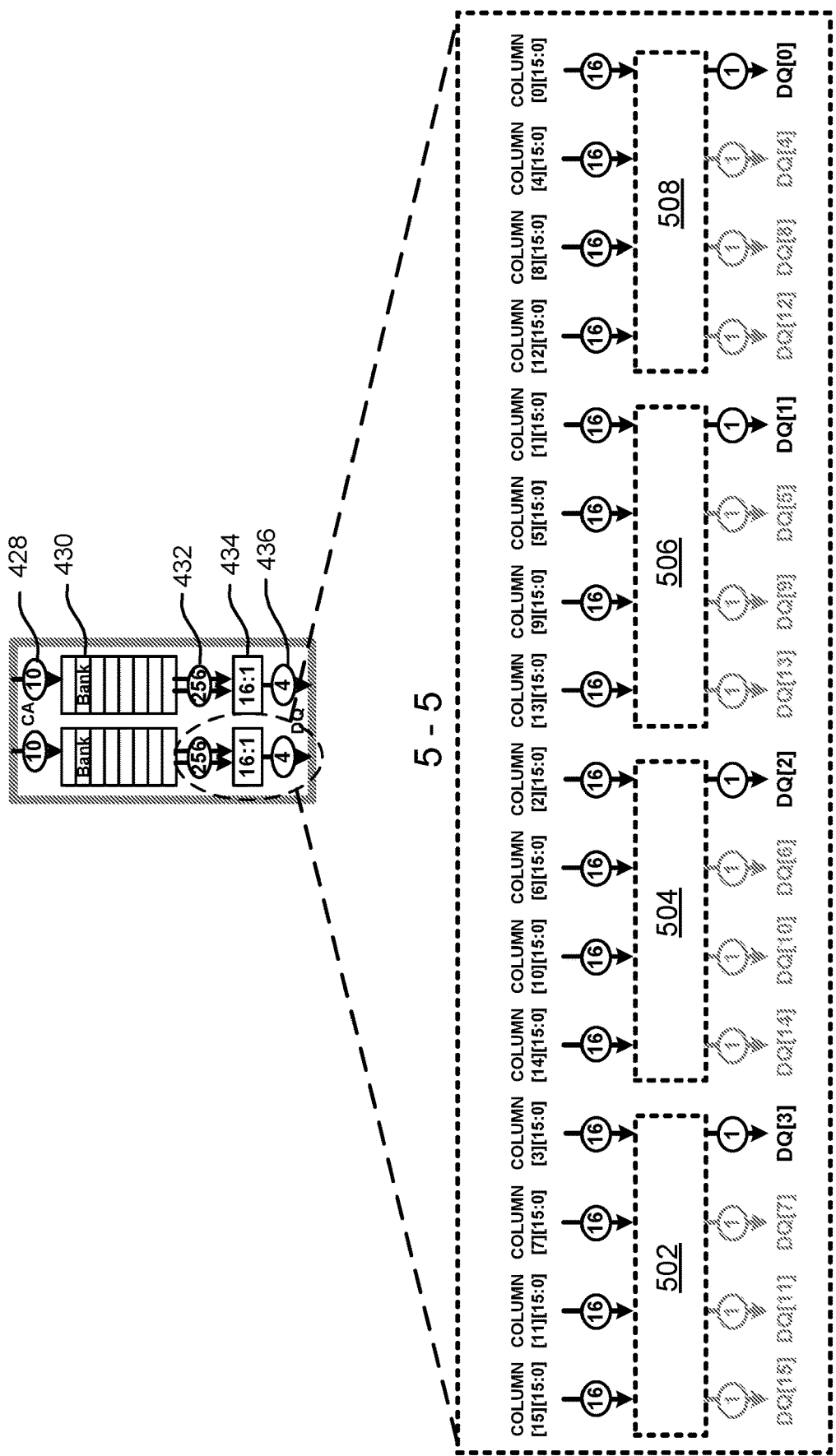
FIG. 5 illustrates further detail of configurable interface circuitry within each of the memory device components of FIG. 1.

FIG. 6A illustrates one embodiment of a data steering circuit 602 that corresponds to one of the four data steering circuits of FIG. 5, with circuitry shown that relates to read data transfers. Circuitry relating to write data transfers is shown in FIG. 6B. The data steering circuit 602 includes four data flow paths 604, 606, 608 and 610 that generally correspond to the four groups of internal I/Os, and the four external data interface I/Os identified as DQ[0], DQ[4], DQ[8] and DQ[12]. A first one of the data flow paths 604 includes a first group of sixteen internal data paths, at 612, that feed a first 16:1 serializer 614. When enabled, the first serializer 614 outputs serialized data in a 16:1 serialization ratio to external I/O DQ[12]. As shown, the first path 604 is generally enabled when the memory device is configured 16 bits wide. A second one of the paths 606 feeds the first group of sixteen data paths 612 in addition to a second group of sixteen data paths, at 616, to a first multiplexer 618. A control signal $SEL_A$ selects one of the two inputs to pass to a second 16:1 serializer 620, depending on the desired width configuration. When enabled, the first multiplexer 618 functions to either directly pass the second input through, without additional serialization, or to alternatingly pass each input in an interleaved fashion to provide an additional level of serialization to the read data prior to feeding to the second serializer 620. When enabled, the second serializer 620 outputs data serialized in a 16:1 ratio out to external I/O DQ[8]. As shown, the second path 606 is generally enabled when the memory device is configured 8 bits wide (cooperating with the fourth data flow path 610) or 16 bits wide. A third one of the paths, at 608, includes a third group of sixteen data paths 622 that feeds a third 16:1 serializer 624. When enabled, the third serializer 624 outputs data serialized in a 16:1 ratio out to external I/O DQ[4]. As shown, the third path 608 is generally enabled only when the memory device is configured 16 bits wide.

With continued reference to FIG. 6A, a fourth one of the data flow paths, at 610, includes a second multiplexer 626 having four inputs that receive data from the four groups of internal column data paths. The second multiplexer 626 responds to a two-bit control signal $SEL_B$ for sequentially selecting which inputs to block, and which inputs to pass, to a fourth 16:1 serializer 628. The fourth data flow path 610 is utilized for a 4 bit wide configuration (on its own), an 8 bit wide configuration (in cooperation with the second path) and a 16 bit wide configuration (cooperating with all the paths), with the selection of inputs controlled by the second multiplexer 626. The second multiplexer also provides a first level of serialization prior to the data being fed to the fourth serializer 628. For instance, in a 16 bit wide mode, no additional serialization is applied to data entering from input 0. In an 8 bit wide mode, data from inputs 0 and 1 are interleaved, resulting in a first 2:1 serialization applied to the data prior to further being serialized by the fourth serializer 628. In the 4 bit wide mode, all four inputs are interleaved, resulting in a first 4:1 serialization ratio prior to being passed to the fourth serializer 628 for an additional 16:1 serialization. With the data steering circuit 602 configured to support a 4 bit wide interface, as shown, the resulting single-bit data stream is then output as read data via the I/O circuit DQ[0].

FIG. 6B illustrates further detail of one embodiment of a configurable data steering circuit 602, with circuitry shown for routing write data. Generally, the write circuitry for the data steering circuit is similar to the read circuitry, with much of the serialization and selection functions reversed for write operations. When operating as a 4 bit wide device, write data received by each data I/O will be deserialized at a ratio that is four-times as high as a deserialization ratio for data received by a device operating in a 16 bit wide mode. Operation as an 8 bit wide device thus has twice the deserialization ratio as when operating as a 16 bit wide device. While not explicitly shown, a second level of deserialization is performed in the write data steering circuit to account for the differences in received data serialization ratios associated with the different width modes.

Further referring to FIG. 6B, the write circuitry for the data steering circuit 602 includes a first write data path 630 that employs a first write multiplexer 632 for feeding selected write data to a first group of internal write data paths 634. The first write multiplexer 632 includes a first input "0" that receives deserialized data directly from an output of a first deserializer 636. A second input "1" receives deserialized data from a second data flow path 638, while a third input "2" receives deserialized data from a fourth data flow path 640. A control signal $SEL_C$ selects which combination of inputs provides data to the first group of internal column data paths 634, depending on whether the memory device is configured as a 16 bit wide device (input 0), an 8 bit wide device (inputs 0 and 1), or a 4 bit wide device (input 2).

With continued reference to FIG. 6B, the second write data path 638 includes a second write multiplexer 642 having a first data input "0" to receive deserialized write data from a second deserializer 644. The second write multiplexer 642 has a second data input "1" to receive deserialized data from the fourth data path 640. A control signal $SEL_D$ fed to a control input selects between the two data inputs, depending on the configured width of the memory device (input 0 selected for 16 bit wide and 8 bit wide modes, input 1 selected for the 4 bit wide mode).

Further referring to FIG. 6B, a third write data path 646 includes a third write multiplexer 648 that operates similar to the second write multiplexer 642, with inputs receiving deserialized data from a third deserializer 650 and the fourth path 640, respectively. A control signal $SEL_E$ selects between the inputs based on the width configuration of the memory device (input 0 for a 16 bit wide mode, input 1 for 8 bit wide and 4 bit wide modes). The fourth write data path 640 directly feeds deserialized write data from a fourth deserializer 652 to a fourth group of internal column paths 654 for all width configurations.

FIG. 6C illustrates a configuration decoder that correlates the various control signal values to the various configurable widths of the data steering circuitry for both the read (transmit DQs) and write (receiver DQs) contexts.

Configuring the memory devices of FIGS. 2 and 4 in different width modes may be carried out in a variety of ways. For one embodiment, mode register circuitry in each memory device may be employed, and may utilize memory device register fields that are programmable to accomplish certain variable width control settings. In such an embodiment, the memory controller 102 issues MRW commands to load the memory device mode registers with appropriate settings relating to the desired I/O width, such that lookup table (or other storage) settings for the control signal values may be accessed to properly configure the read and write data steering circuitry.

Figure 7:
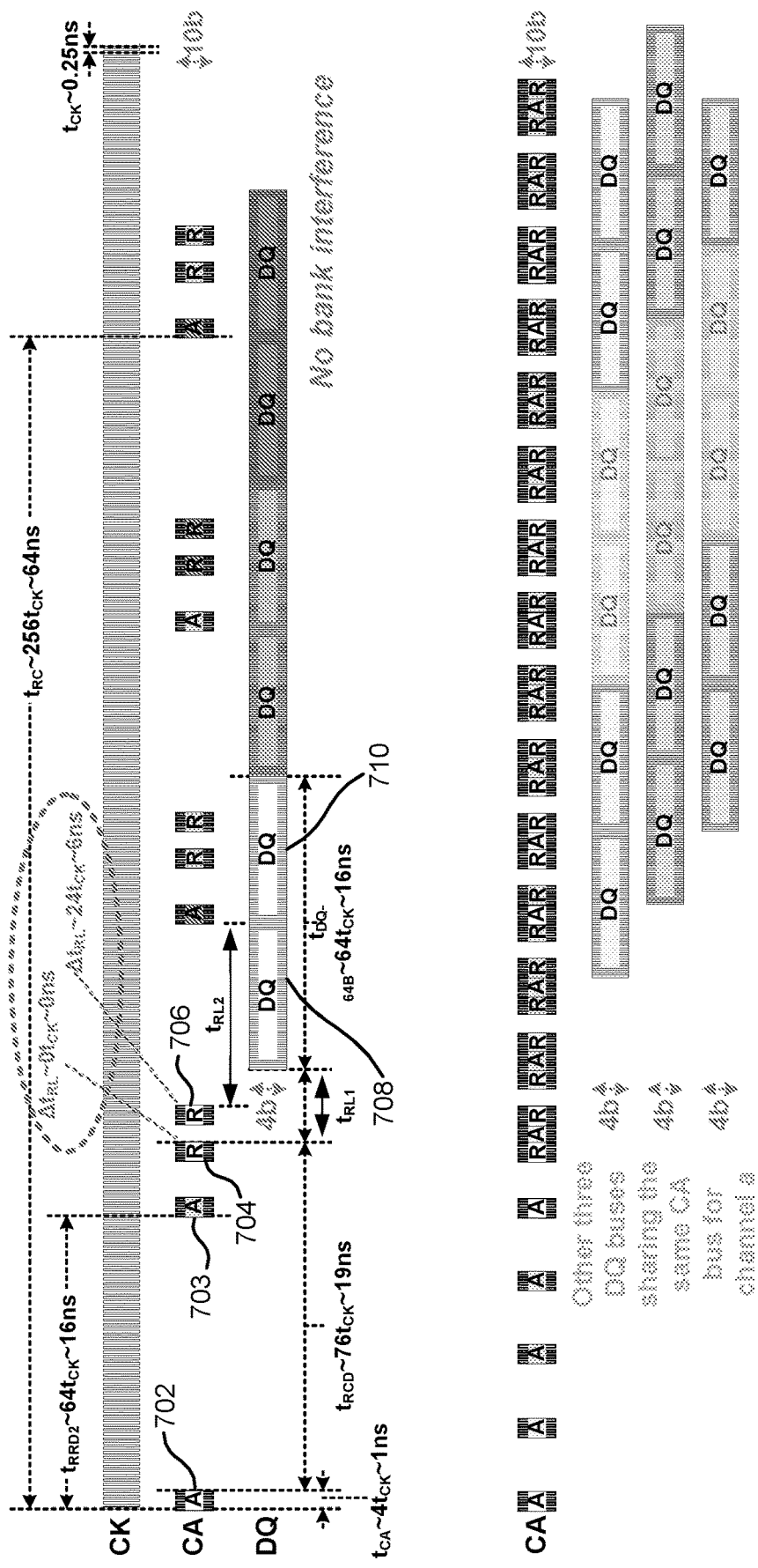
FIG. 7 illustrates a timing chart for read operations carried out by the memory system and topology of FIG. 4.

FIG. 7 illustrates a timing chart showing various command and data signal timings for multiple read operations involved in the four channel architecture shown in FIG. 5. The top three timing axes relate to signal timing for a first one of the four channels of FIG. 5. The timing axes relate to clock signal timing CK, command signal timing CA, and data signal timing DQ. The CA and DQ axes are reproduced in the bottom timing axes to illustrate the timings for the other three memory channels.

Further referring to FIG. 7, for a first read operation, an activate command is issued by the memory controller, at 702. A subsequent activate command for a subsequent read operation may be issued by the memory controller following a second delay $t_{RRD2}$, at 703. Note that due to differences in serialization ratios between the first and second memory system modes, the timing delays $t_{RRD1}$ and $t_{RRD2}$ between the two modes are different. Following a timing interval $t_{RCD}$, dual read commands are issued, at 704 and 706, with first read data associated with the first read command, at 708, transferred back to the memory controller consistent with a first read timing interval $t_{RL1}$, and second read data associated with the second read command, at 710, transferred back consistent with a second read timing interval $t_{RL2}$. Note that due to the serialization ratio and latency associated with the 4 bit wide memory device configuration, the read data timing $t_{RL1}$ between launch of the first read command and receipt of the first read data may be different than the read data timing $t_{RL2}$ between launch of the second read command and receipt of the second read data. The three other channels operate similarly, in a pipelined fashion, to more fully optimize channel occupancy.

While operation of the memory architecture described above works well to increase memory capacity and performance, the number of shared connections employed by the multi-drop C/A bus may have a performance ceiling for some applications that doesn't contribute to optimal performance of the memory system as a whole. In an effort to provide an enhanced C/A signaling bus, a further embodiment of a memory system is shown in FIG. 8.

Figure 8:
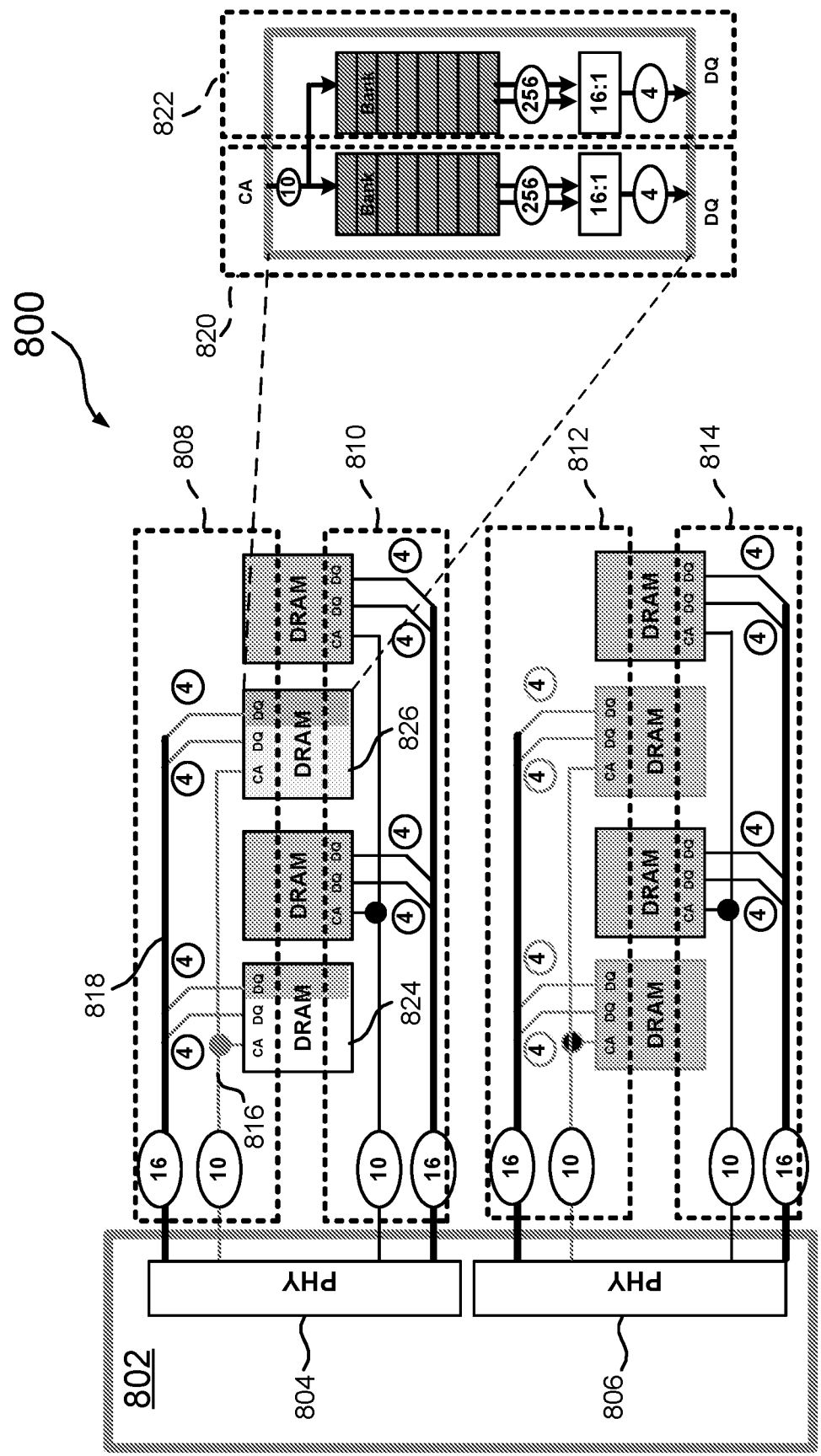
FIG. 8 illustrates a third embodiment of the memory system of FIG. 1 that corresponds to a third operating mode.

Referring now to FIG. 8, a third embodiment of a memory system, generally designated 800, corresponds to a third specific topology for the memory system 100 of FIG. 1. The architecture is similar to the above-described embodiments in that a memory controller 802 employs two memory controller physical (PHY) interface circuits 804 and 806 that each control two memory channels 808, 810, and 812, 814. For each memory channel, a command/address (C/A) bus 816 and a data bus 818 couple multiple bank groups 820 and 822 of memory associated with each of two of the multiple memory devices 824, and 826 to the memory controller 802. Similar to the second embodiment described above, the data bus 818 includes sixteen data links with groups of four signaling links routed to each bank group in each memory device. Thus, with an embodiment that employs two bank groups of 4 bit wide interfaces, each memory device is configured as a 4 bit wide device. This forms a point-to-point relationship between the memory controller 802 and the data I/0s of each memory device. However, the C/A bus 816, while still including ten C/A signal paths, only shares signals between two bank groups of two memory devices, thus defining a point-to-2point topology rather than the point-to-4point topology exhibited by the second embodiment. With the reduction in connections to each C/A bus, the signaling rate for the third memory system mode may be an integer multiple of the signaling rates employed by the previously described modes.

Figure 9:
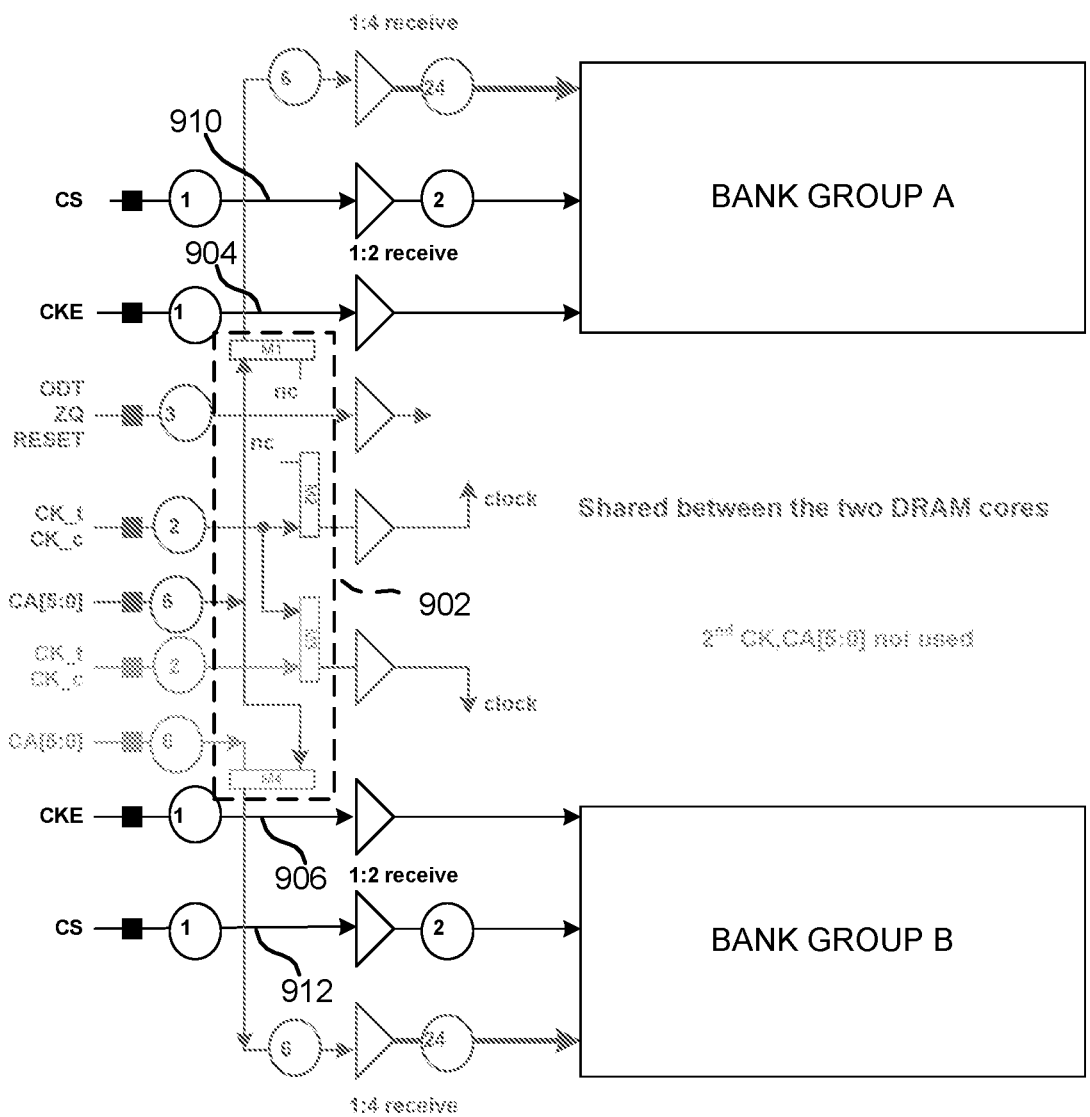
FIG. 9 illustrates further detail of one embodiment of a configurable command/address (C/A) steering circuit utilized in the memory system embodiments of FIGS. 2, 4 and 8.

In order to support the sharing of the C/A signal paths between the two bank groups of each memory device, the third embodiment 800 provides logic in the form of C/A steering circuitry 902 (shown generally in FIG. 9, phantom) to configure use of each memory device C/A interface to support the previously disclosed C/A bus topologies (multi-drop point-to-4point), and also a signal-integrity optimized point-to-2point configuration for the third system embodiment. FIG. 9 illustrates one embodiment of the C/A steering circuitry 902 employed on a memory device that includes two independent bank groups, bank group A and bank group B. Each bank group includes a clock enable CKE signal path, at 904 and 906, and a chip select CS signal path, at 910 and 912, for all modes. Further, signals associated with on-die termination (ODT), drive strength (ZQ) and reset are generally shared between the bank groups, for all modes. In the previously disclosed modes, the C/A bus included separate enabled paths directed to each bank group for clock signals (CK_t, CK_c), and command address (CA) signals. To enable sharing of these signals between bank groups, multiple multiplexers M1, M2, M3 and M4 are provided to appropriately steer the signals, depending on the configuration mode. Multiplexers M1 and M2 generally employ one connected input, ensuring that a first set of clock and CA signals are utilized in all modes. Multiplexers M3 and M4, however, include separate inputs from each of the sets of clock and CA signals. Thus, by merely providing a control signal to each multiplexer corresponding to the desired input, the configuration may be straightforwardly selected.

Figure 10:
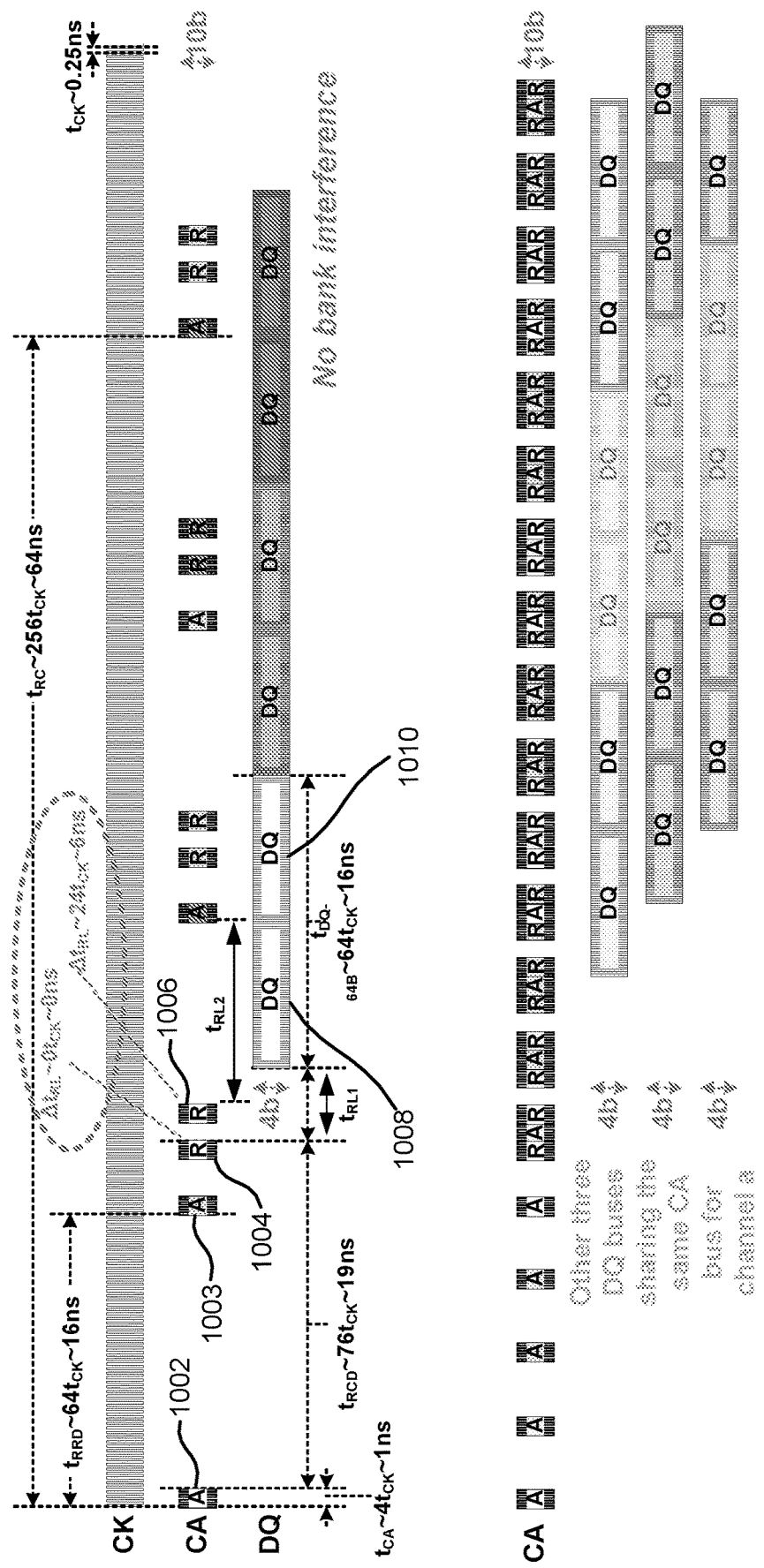
FIG. 10 illustrates a timing chart for read operations carried out by the memory system and topology of FIG. 8.

FIG. 10 illustrates a timing chart similar to those of FIGS. 3 and 7, showing various command and data signal timings for multiple read operations involved in the four channel architecture shown in FIG. 8. The top three timing axes relate to signal timing for a first one of the four channels of FIG. 8. The timing axes relate to clock signal timing CK, command signal timing CA, and data signal timing DQ. The CA and DQ axes are reproduced in the bottom timing axes to illustrate the timings for the other three memory channels.

Further referring to FIG. 10, for a first read operation, an activate command is issued by the memory controller, at 1002. A subsequent activate command for a subsequent read operation may be issued by the memory controller following a second delay $t_{RRD3}$, at 1003. Note that due to differences in serialization ratios between the first and second memory system modes, the timing delays $t_{RRD1}$ (first described mode) and $t_{RRD3}$ between the two modes are different. Following a timing interval $t_{RCD}$, dual read commands are issued, at 1004 and 1006, with read data associated with the first read command, at 1008, transferred back to the memory controller consistent with a first read timing interval $t_{RL1}$, and second read data associated with the second read command, at 1010, transferred back consistent with a second read timing interval $t_{RL2}$. Similar to the second embodiment described above, due to the serialization ratio and latency associated with the 4 bit wide memory device configuration, the read data timing $t_{RL1}$ between launch of the first read command and receipt of the first read data may be different than the read data timing $t_{RL2}$ between launch of the second read command and receipt of the second read data. The three other channels operate similarly, in a pipelined fashion, to more fully optimize channel occupancy.

Those skilled in the art will appreciate that the architecture described above provides a configurable memory system architecture capable of increased capacity and performance, depending on the application. The various configurations provide balanced capacity and performance tradeoffs to maximize flexibility and cost efficiency.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While the invention has been described with reference to specific embodiments thereof, it will be evident that various modifications and changes may be made thereto without departing from the broader spirit and scope of the invention. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

I claim:

1. An integrated circuit (IC) memory controller, comprising:
   a first command/address (C/A) interface to transmit, to a first memory C/A interface of a first bank group of memory, first and second read commands for first and second read data;
   a second command/address (C/A) interface to transmit, to a second memory C/A interface of a second bank group of memory, third and fourth read commands for third and fourth read data;
   receiver circuitry to receive the first and second read data via a first data link interface and to receive the third and fourth read data via the second data link interface, the third and fourth read data received in a pipelined fashion with respect to the first and second read data;
   wherein for a first operating mode, the first and second read data are received after respective first delays following transmission of the first and second read commands and wherein the first and second data are received at a first serialization ratio; and
   wherein for a second operating mode, the first and second read data are received after respective second and third delays following transmission of the first and second read commands, the second and third delays being different from the first delays and from each other, and wherein the first and second data are received at a second serialization ratio that is different than the first serialization ratio.

2. The IC memory controller of claim 1, wherein:
   the first and second data link interfaces operate at a first signaling rate; and
   wherein the first and second controller C/A interfaces operate at a second signaling rate that is one-half the first signaling rate.

3. The IC memory controller of claim 2, wherein:
for the first operating mode, the first and second data link interfaces operate at the first signaling rate; and
for the second operating mode, the first and second data link interfaces operate at a third signaling rate that is an integer multiple of the first signaling rate.

4. The IC memory controller of claim 1, wherein:
for the first operating mode, the first and second controller C/A interfaces operate at a first C/A signaling rate; and
for the second operating mode, the first and second controller C/A interfaces operate at a second C/A signaling rate that is an integer multiple of the first C/A signaling rate.

5. The IC memory controller of claim 1, further comprising:
timing logic to
for the first operating mode, apply a first delay between successive activate commands; and
for the second operating mode, apply a second delay between successive activate commands that is different than the first delay.

6. The IC memory controller of claim 1, wherein:
the first and second bank groups of memory are in a common integrated circuit (IC) memory device.

7. The IC memory controller of claim 1, wherein:
the first delays are based on the first serialization ratio; and
the second delays are based on the second serialization ratio.

8. The IC memory controller of claim 1, wherein:
wherein for the first operating mode, the third and fourth read data are received after the respective first delays following transmission of the third and fourth read commands; and
wherein for the second operating mode, the third read data is received after the second delay following transmission of the third read command, and the fourth read data is received after a third delay following transmission of the fourth read command, the second delay being different than the third delay.

9. A method of operation in an integrated circuit (IC) memory controller, the method comprising:
operating first and second command/address (C/A) interfaces independently from one another;
for a first operating mode,
dispatching first and second read commands for first and second read data, and receiving the first and second read data in accordance with a first read delay and at a first serialization ratio; and
for a second operating mode,
dispatching the first and second read commands for the first and second read data, and receiving the first read data at a second serialization ratio in accordance with the first read delay and receiving the second read data at the second serialization ratio in accordance with the second read delay, wherein the second read delay parameter is different than the first read delay.

10. The method of claim 9, further comprising:
for the first operating mode, transferring the first and second data via first and second data link interfaces in accordance with the first serialization ratio; and
for the second operating mode, transferring the first and second data via the first and second data link interfaces in accordance with the second serialization ratio.

11. The method of claim 10, further comprising:
operating the first and second data link interfaces at a first signaling rate; and
operating the first and second C/A interfaces at a second signaling rate that is one-half the first signaling rate.

12. The method of claim 11, wherein:
for the first operating mode, operating the first and second data link interfaces at the first signaling rate; and
for the second operating mode, operating the first and second data link interfaces at a third signaling rate that is an integer multiple of the first signaling rate.

13. The method of claim 9, further comprising:
for the first operating mode, operating the first and second C/A interfaces at a first C/A signaling rate; and
for the second operating mode, operating the first and second C/A interfaces at a second C/A signaling rate that is an integer multiple of the first C/A signaling rate.

14. The method of claim 9, further comprising:
for the first operating mode, applying a first delay between successive activate commands; and
for the second operating mode, applying a second delay between successive activate commands that is different than the first delay.

15. A dynamic random access (DRAM) memory controller, comprising:
a physical circuit (PHY) interface for coupling to a first memory channel and a second memory channel independent from the first memory channel, each of the first and second memory channels including a command/address (C/A) interface;
wherein the PHY interface is configurable to operate in one of at least two modes including
a first operating mode to dispatch first and second read commands for first and second read data in accordance with a first read delay and at a first serialization ratio; and
a second operating mode to dispatch the first and second read commands for the first and second read data in accordance with a second read delay and at a second serialization ratio, wherein the second read delay is different than the first read latency parameter.

16. The IC memory controller of claim 15, wherein:
the first read delay comprises a first delay interval between transmission of the first read command and receipt of the first read data; and
the second read delay comprises a second delay interval between transmission of the second read command and receipt of the second read data.

17. The IC memory controller of claim 15, wherein each of the first and second memory channels include:
a first data link interface;
a second data link interface; and
wherein for the first operating mode, the first and second data link interfaces transfer data at a first serialization ratio, and for the second operating mode, the first and second data link interfaces transfer data at a second serialization ratio that is different from the first serialization ratio.

18. The IC memory controller of claim 17, wherein:
the first and second data link interfaces operate at a first signaling rate; and
wherein the first and second C/A interfaces operate at a second signaling rate that is one-half the first signaling rate.

19. The IC memory controller of claim 18, wherein:
for the first operating mode, the first and second data link interfaces operate at the first signaling rate; and
for the second operating mode, the first and second data link interfaces operate at a third signaling rate that is an integer multiple of the first signaling rate.

20. The IC memory controller of claim 15, wherein:
for the first operating mode, the first and second C/A interfaces operate at a first C/A signaling rate; and
for the second operating mode, the first and second C/A interfaces operate at a second C/A signaling rate that is an integer multiple of the first C/A signaling rate.

* * * * *